United States Patent
Lin et al.

(10) Patent No.: US 6,187,644 B1
(45) Date of Patent: Feb. 13, 2001

(54) METHOD OF REMOVING OXYNITRIDE BY FORMING AN OFFSET SPACER

(75) Inventors: Tony Lin, Tien-Liao Hsiang; Tung-Po Chen, Taichung, both of (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/391,934

(22) Filed: Sep. 8, 1999

(51) Int. Cl.$^7$ .................................................. H01L 21/336
(52) U.S. Cl. ..................... 438/303; 438/197; 438/595; 438/952
(58) Field of Search .................................... 438/197, 303, 438/595, 783, 786, 952

(56) References Cited

U.S. PATENT DOCUMENTS

| | | | |
|---|---|---|---|
| 5,891,784 | * 4/1999 | Cheung et al. | 438/783 |
| 5,902,125 | * 5/1999 | Wu | 438/952 |
| 6,004,853 | * 12/1999 | Yang et al. | 438/952 |
| 6,063,704 | * 5/2000 | Demirlioglu | 438/786 |

* cited by examiner

Primary Examiner—Trung Dang
(74) Attorney, Agent, or Firm—Harness, Dickey & Pierce, P.L.C.

(57) ABSTRACT

A method for forming a semiconductor device is disclosed. The method includes providing a semiconductor substrate, followed by forming a gate oxide layer and a conductive layer over the substrate. An anti-reflective coating is then formed on the conductive layer. After patterning to etch the anti-reflective coating and the conductive layer, a gate region is thus formed. A dielectric layer is formed over the gate region, and is then subjected to etching back, therefore forming an offset spacer on sidewall of the gate region while simultaneously removing surface oxide of the anti-reflective coating. Finally, anti-reflective coating is removed.

13 Claims, 2 Drawing Sheets

METHOD OF REMOVING OXYNITRIDE BY FORMING AN OFFSET SPACER

BACKGROUND OF THE INVENTION

1. Field of the Invention

The present invention relates to a method for forming a semiconductor device, and more particularly, to a method for improving SiON residue oxide problem by forming a sidewall offset spacer.

2. Description of the Prior Art

As the semiconductor device, such as metal oxide semiconductor (MOS), becomes highly integrated, the area occupied by the device shrinks, as well as the design rule.

As the MOS devices are scaled down to about 0.18 micrometer or below, a SiON layer is usually deposited on the surface of a polygate, serving as an anti-reflective coating and critical dimension (CD) control. Unfortunately, the use of this SiON layer has some side effects on the formation of the MOS devices. For example, the surface of the SiON layer is apt to be oxidized. This surface oxide disadvantageously retards the following SiON removing by $H_3PO_4$ etching. Further, the $H_3PO_4$ etchant will attack the polygate, resulting in polysilicon peeling.

For the foregoing reasons, there is a need for a method of improving SiON residue oxide problem and the polysilicon peeling issue while forming a semiconductor device.

SUMMARY OF THE INVENTION

In accordance with the present invention, a method is provided for forming a semiconductor device that substantially improves the SiON residue problem by simultaneously removing SiON surface oxide during the formation of the offset spacer.

Another object of the present invention is to eliminate the implanted polysilicon peeling problem by use of the offset spacer.

A further object of the present invention is to reduce the capacitance between the gate and the drain ($C_{gd}$), thereby enhancing device performance.

In one embodiment, the present invention includes firstly providing a semiconductor substrate having at least one shallow trench isolation (STI) region formed therein. Next, a gate oxide layer and a polysilicon layer are formed over substrate. After implanting the polysilicon layer, an oxynitride layer is deposited on the polysilicon layer, wherein the oxynitride layer serves as an anti-reflective coating. A photoresist layer is then formed on the oxynitride layer to define a gate region. After etching the oxynitride layer and the polysilicon layer, a gate region is thus formed. A dielectric layer is deposited over the gate region, followed by anisotropically etching back the dielectric layer to form an offset spacer on sidewall of the gate region while simultaneously removing surface oxide of the oxynitride layer. Finally, the oxynitride layer is removed using a wet etch.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A shows the cross section illustrative of forming a gate oxide layer, a polysilicon layer, a polycide layer, and a SiON layer;

FIG. 1B shows the cross section illustrative of forming the Photoresist layer;

FIG. 1C shows the cross section illustrative of forming a silicon oxide layer on the gate region;

FIGURE 1D shows the cross section illustrative of forming an offset spacer; and

FIG. 1E shows the cross section illustrative of removing the SiON layer.

DESCRIPTION OF THE PREFERRED EMBODIMENT

Figure 1A:
FIGS. 1A to 1E show cross-sectional views illustrative of various stages in the fabrication of a semiconductor device in accordance with one embodiment of the present invention, specifically.

Referring to FIG. 1A, a semiconductor substrate 10, such as a silicon substrate, is initially provided. This substrate 10 has an N-type type well inside and some isolation regions 14, such as shallow trench isolation (STI) regions. Although the present embodiment is exemplified by the N-type well and the STI regions, it is appreciated that other conductivity type of well and other isolation scheme can be well adapted to the present invention. A silicon oxide layer, which serves as a gate oxide layer, is formed on the surface of the substrate 10. Next, a polysilicon layer 18 having a thickness of about 1500–2500 angstroms is deposited on the gate oxide layer 16. In this embodiment, the polysilicon layer 18 is formed by a standard low pressure chemical vapor deposition (LPCVD). The deposited polysilicon layer 18 is further doped to increase its conductivity. Usually, the polysilicon layer 18 is doped by introducing ions P or ions As using a conventional thermal diffusion process or ion implantation.

A silicon oxynitride or oxynitride (SiON) layer 20 is then deposited on the surface of the polysilicon layer 18. The oxynitride layer 20 can be formed using a conventional technique such as chemical vapor deposition (CVD), but preferably a plasma-enhanced chemical vapor deposition (PECVD). The thickness of the oxynitride layer can be in the range of about 200 to 500 angstroms. Particularly, the oxynitride layer 20 is primarily used as an anti-reflective coating in a following photolithography process.

Figure 1B:
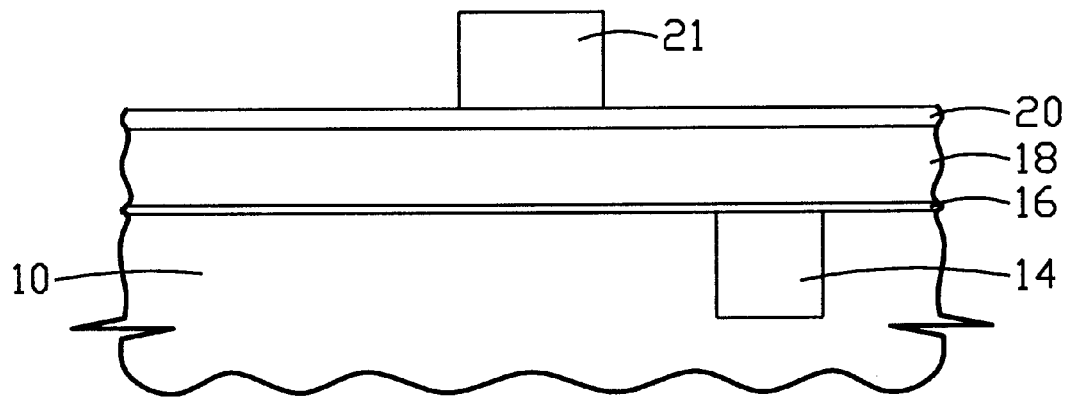

A photoresist layer 21 is then formed and patterned on the oxynitride layer 20 using conventional photolithography techniques, defining a gate area in an active area, i.e., within the well region and between adjacent STI regions as shown in FIG. 1B.

Figure 1C:
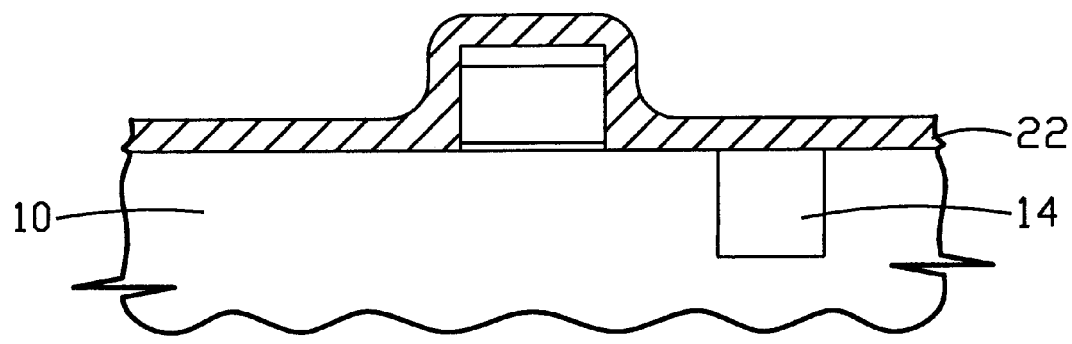

Thereafter, an anisotropic etching process is performed, using the photoresist layer 21 as an etching mask. The resultant gate structure is formed. A silicon oxide layer 22 is then deposited over the gate region and the exposed substrate 10. The silicon oxide layer 22 has a thickness in the range of about 100 to 600 angstroms as shown in FIG. 1C.

Figure 1D:
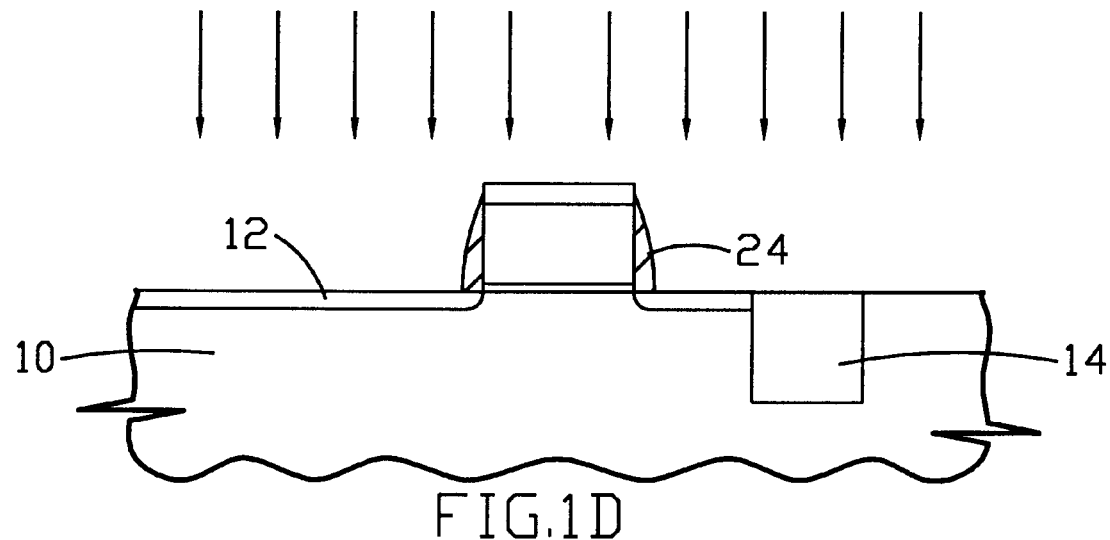
Figure 1E:
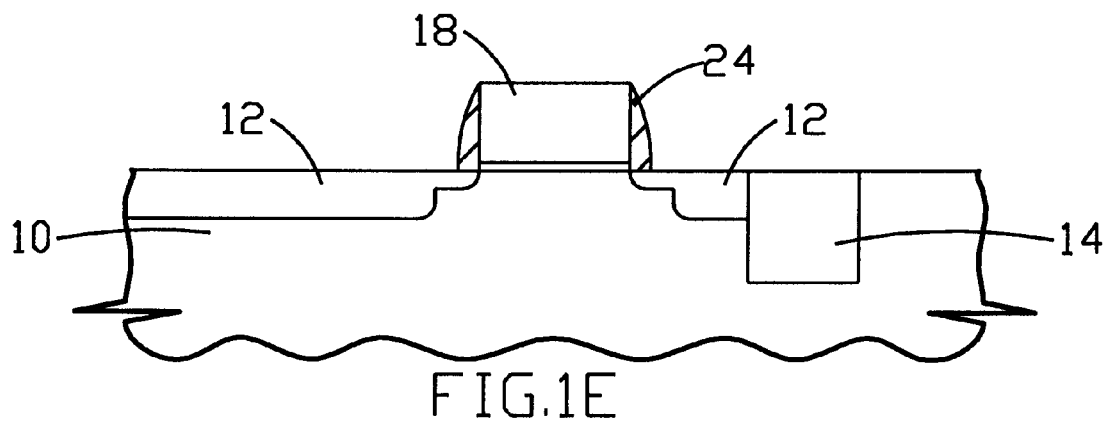

The silicon oxide layer 22 is then subjected to an etching back process, thereby forming an offset spacer 24 on the sidewall of the polysilicon layer 18, as shown in FIG. 1D. It is noted that the unwanted oxide on the surface of the oxynitride layer 20 is simultaneously removed during the etching back step. The offset spacer 24, which is also referred to as an offset offset spacer, can be formed using any suitable anisotropic etch process used in wafer fabrication, but is preferably a conventional dry etch. The resultant offset spacer 24, with the gate region, is used as a hard mask in subsequent ion implantation step to form the source/the drain 12, and as a means for eliminating the SiON residue problem of the oxynitride layer 20. An isotropic etch, such as a standard wet etch process, therefore removing the oxynitride layer 20 as shown in FIG. 1E.

According to the present invention, the SiON residue problem can be substantially improved by simultaneously removing SiON surface oxide during the formation of the offset spacer 24. Further, the implanted polysilicon peeling problem can be eliminated due to the offset offset spacer 24. Moreover, the capacitance between the gate and the drain ($C_{gd}$) can be reduced, enhancing device performance.

Although specific embodiments have been illustrated and described, it will be obvious to those skilled in the art that various modifications may be made without departing from what is intended to be limited solely by the appended claims.

What is claimed is:

1. A method for forming a semiconductor device, comprising:

providing a semiconductor substrate;

forming a gate oxide layer on said substrate;

forming a conductive layer on said gate oxide layer;

forming an anti-reflective coating on said conductive layer;

patterning to etch said anti-reflective coating and said conductive layer, thus forming a gate region;

forming a dielectric layer over the gate region;

etching back said dielectric layer to form an offset spacer on sidewall of said conductive layer; and removing said anti-reflective coating.

2. The method according to claim 1, wherein said gate oxide layer comprises silicon oxide.

3. The method according to claim 1, wherein said conductive layer comprises polysilicon.

4. The method according to claim 1, wherein said anti-reflective coating comprises oxynitride.

5. The method according to claim 1, wherein said dielectric layer comprises silicon oxide.

6. The method according to claim 1, wherein said dielectric layer is etched back by an anisotropic dry etch.

7. The method according to claim 1, wherein said anti-reflective coating is removed by a wet etch.

8. The method according to claim 7, wherein said wet etch uses $H_3PO_4$ solvent.

9. A method for forming a semiconductor device, comprising:

providing a semiconductor substrate having at least one shallow trench isolation (STI) region formed therein;

forming a gate oxide layer on surface of said substrate;

forming a polysilicon layer on said gate oxide layer;

introducing ions into said polysilicon layer;

depositing an oxynitride layer on said polysilicon layer, wherein said oxynitride layer serves as an anti-reflective coating;

forming a photoresist layer on said oxynitride layer, pattern of said photoresist layer defining a gate area within the well region;

etching said oxynitride layer and said polysilicon layer, thus forming a gate region, wherein oxide is formed on surface of said oxynitride layer;

depositing a dielectric layer over the gate region;

anisotropically etching back said dielectric layer to form an offset spacer on sidewall of the gate region, and simultaneously remove the surface oxide; and removing said oxynitride layer use $H_3PO_4$ solvent.

10. The method according to claim 9, wherein said ions are thermally diffused into said polysilicon layer.

11. The method according to claim 9, wherein said polysilicon layer is doped with ions P or ions As.

12. The method according to claim 9, wherein said dielectric layer has a thickness of about 100–600 angstroms.

13. The method according to claim 9, wherein aid dielectric layer comprises silicon oxide.

* * * * *